United States Patent [19]
Bickford et al.

[11] Patent Number: 5,609,489
[45] Date of Patent: Mar. 11, 1997

[54] SOCKET FOR CONTACTING AN ELECTRONIC CIRCUIT DURING TESTING

[75] Inventors: Joel D. Bickford; Julius K. Botka, both of Santa Rosa, Calif.

[73] Assignee: Hewlett-Packard Company, Palo Alto, Calif.

[21] Appl. No.: 360,507

[22] Filed: Dec. 21, 1994

[51] Int. Cl.⁶ ..................................... H01R 9/09
[52] U.S. Cl. ............................................... 439/72
[58] Field of Search .............................. 439/70, 73, 331, 439/525

[56] References Cited

U.S. PATENT DOCUMENTS

| | | | |
|---|---|---|---|
| 4,835,464 | 5/1989 | Slye et al. | 324/158 F |
| 5,069,629 | 12/1991 | Johnson | 439/71 |
| 5,192,215 | 3/1993 | Grabbe et al. | 439/73 |
| 5,199,883 | 4/1993 | Uratsuji | 439/70 |
| 5,207,584 | 5/1993 | Johnson | 439/66 |
| 5,336,094 | 8/1994 | Johnson | 439/62 |
| 5,407,360 | 4/1995 | Belopolsky | 439/71 |

OTHER PUBLICATIONS

Test Socket Performance Handbook, David A. Johnson and David L. Senum, Copyright 1994, pp. 7 through 12.

*Primary Examiner*—P. Austin Bradley
*Assistant Examiner*—Jill DeMello

[57] ABSTRACT

An electronic circuit tester for measuring the response to electrical signals applied to an electronic circuit under test is provided with a socket for effecting connection between a packaged device or integrated circuit being tested to a device-under-test (DUT) board incorporated into a fixture board of the tester. The socket includes an electrically insulative housing having at least one longitudinal slot and two transverse channels, an elastomeric member disposed in each of the channels and spanning the width of the slot, an electrically conductive contact frame disposed in the slot and mechanically biased by the elastomeric members against the DUT board, and an electrically conductive contact in sliding contact with the contact frame, the contact having a first end configured to electrically contact the lead of the electronic circuit with a second end of the contact being in engagement with the second elastomeric member to mechanically bias the first end of the contact against the lead of the electronic circuit. The socket increases repeatability of connections and accuracy of measurements with the electronic circuit tester.

18 Claims, 5 Drawing Sheets

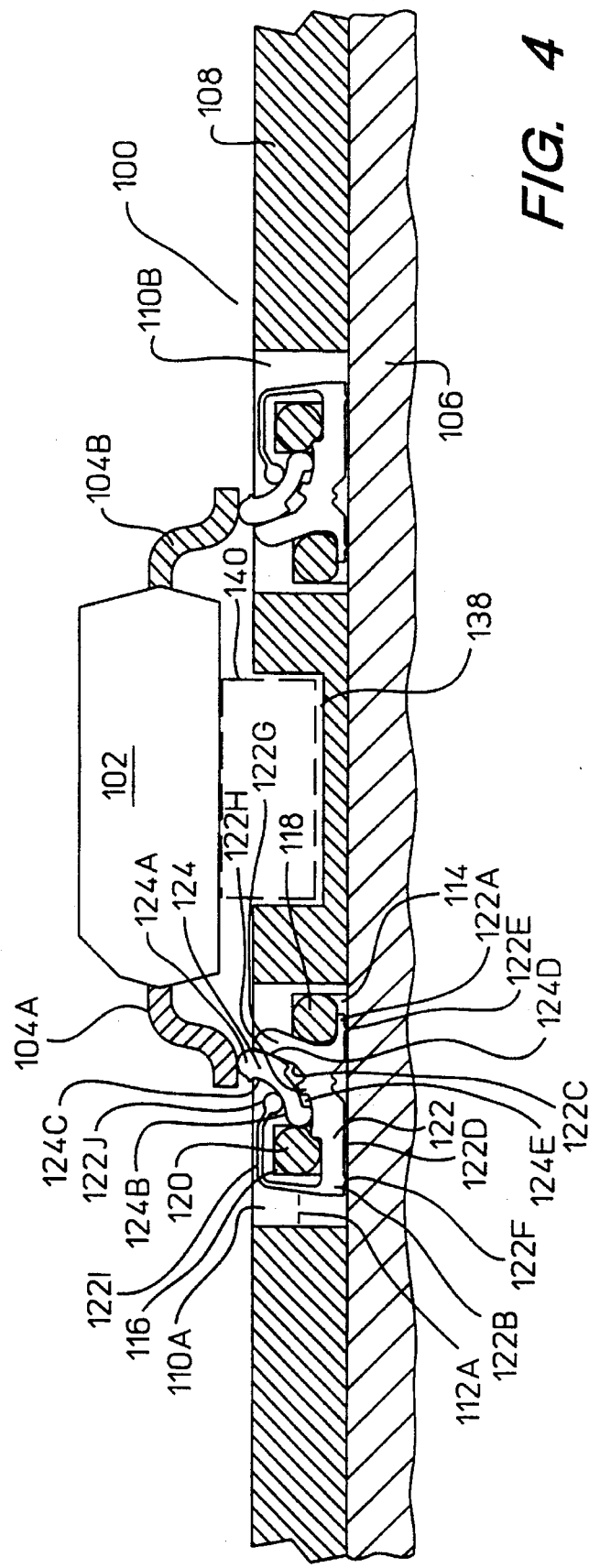
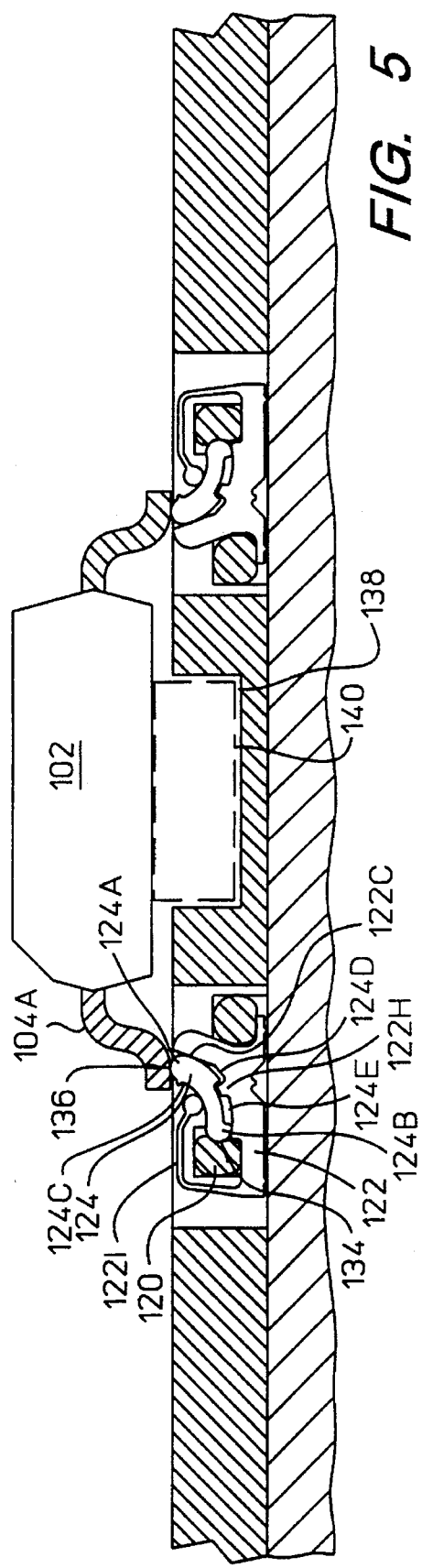

SOCKET FOR CONTACTING AN ELECTRONIC CIRCUIT DURING TESTING

BACKGROUND OF THE INVENTION

This invention relates to systems for testing electronic circuits by applying and/or measuring electrical signals and, more particularly, to electronic circuit test systems for applying electrical signals to a packaged device or integrated circuit being tested and measuring the response of the device or integrated circuit to the applied electrical signals. Specifically, one embodiment of the invention provides a socket for effecting an electrical connection(s) in an electronic circuit tester between an electronic circuit, such as a packaged device or integrated circuit, being tested and a device-under-test (DUT) board that interfaces to a fixture board of the tester so that electrical signals can be transmitted to and/or received from the electronic circuit for characterizing the performance of the electronic circuit. The socket in accordance with one embodiment of the invention is particularly adaptable to a high-frequency electronic circuit tester for effecting connections between the electronic circuit being tested and the DUT board while minimizing parasitic inductance, capacitance, and phase delay of electrical signals, as well as for increasing repeatability of connections, to improve reliability and accuracy, thereby facilitating measurements with the tester for testing high-frequency devices and integrated circuits and enhancing overall throughput of the tester.

Programmable electronic circuit testers are typically used during the manufacture of electronic devices and integrated circuits to test the performance of the device or integrated circuit being manufactured. Tests are conducted to assure that the device or integrated circuit satisfies associated design performance specifications. In order to test the device or integrated circuit, the electronic circuit tester is programmed to inject an electrical signal or suite of electrical signals into the device or integrated circuit under test and to measure the response(s). For example, the electronic circuit tester can be used to test finished packaged devices and integrated circuits.

A conventional programmable electronic circuit tester, generally indicated by the numeral 10, is shown in FIG. 1. The electronic circuit tester 10 comprises a test head 12 electrically connected by cables routed through a conduit 14 to a rack(s) 16 of electronic test and measurement instruments, such as ac and dc electrical signal generators for applying electrical signals to a device or integrated circuit interfaced to the test head, and signal analyzers, for example, a network analyzer, spectrum analyzer, oscilloscope, or other waveform digitizing and/or signal processing equipment, for measuring the response(s) to those applied electrical signals. The test head 12 can include circuitry which performs distribution of electrical signals, signal separation, frequency translation, amplification, attenuation, switching, or other conditioning or modification of electrical signals prior to being routed to the rack 16 or to a device or integrated circuit being tested.

As shown in FIG. 1, the test head 12 interfaces to a device or integrated circuit through a load board 18 mounted to the test head and a fixture board 20 in turn mounted to the load board. Alternatively, prior to installation of the fixture board 20, a calibration board (not shown) having a configuration similar to the fixture board can be connected to the test head 12 for calibrating the test head. The configuration of the load board 18 depends on the type or family of device or integrated circuit being tested, such as an analog or digital electronic circuit, while the configuration of the fixture board 20 is typically specific to the family or particular device or integrated circuit being tested.

As shown in FIG. 1, the fixture board 20 is in turn interfaced to a DUT board 22 that comprises inductors, capacitors, and/or other electronic components or circuits mounted or fabricated on the DUT board for decoupling, filtering, attenuating, or otherwise modifying electrical signals transmitted to and/or received from a device or integrated circuit being tested. Finally, the DUT board 22 is connected to a socket 24 for effecting an electrical connection(s) between the electronic circuit tester 10 and the actual electric circuit being tested, such as a packaged device or integrated circuit 26.

As also shown in FIG. 1, the test head 12 is mounted on a dolly 28. The test head 12 is preferably mounted by pivotable connections 30 to the dolly 28. The pivotable connections 30 enable the test head 12 to be positioned in an approximately upward facing horizontal position so that the appropriate load board 18 and calibration or fixture board 20 and DUT board 22 with the socket 24 can be mounted on the test head of the electronic circuit tester 10 by an operator. The test head 12 can also be pivoted to any angular position so that the socket 24 can interface with a material handler (not shown), for example, to test the packaged device or integrated circuit 26.

The socket 24 through which the packaged device or integrated circuit 26 is electrically connected to the electronic circuit tester 10 is subjected to many connections and disconnections during actual testing with the tester. However, the useful life of the electronic circuit tester 10 has heretofore far exceeded the useful life of the socket 24. Also, the repeatability and accuracy of the connections that are effected by the socket 24 with the packaged device or integrated circuit 26 decreases over time as the socket degrades due to wear. Moreover, in an electronic circuit tester 10 for testing high-frequency devices and integrated circuits, the known configurations of the socket 24 have a significant electrical signal path length between the lead(s) of the packaged device or integrated circuit 26 being tested and the DUT board 22. This electrical signal path length adds inductance, as well as additional capacitance between leads of the packaged device or integrated circuit 26, which affects the accuracy of measurements and the operating characteristics and/or performance of the packaged device or integrated circuit being tested.

For example, one known socket 24 manufactured by Johnstech International Corporation located in Minneapolis, Minn., is shown in FIG. 2. See, also, U.S. Pat. Nos. 5,069,629 and 5,207,584. S-shaped contacts 32 introduce a significant electrical signal path length between contact with leads 34 of the packaged device or integrated circuit 26 being tested and the DUT board 22 at higher frequencies. The length of the S-shaped contacts 32 contributes added inductance, as well as additional capacitance between the leads 34 of the packaged device or integrated circuit 26. This results in parasitic inductance, capacitance, and phase delay in electrical signals applied to and/or the measured response(s) of the packaged device or integrated circuit 26, which affects the accuracy of the measurements and operating characteristics and/or performance of the packaged device or integrated circuit. The adverse effects increase as the frequency increases.

It would therefore be desirable to provide a socket structure to repeatably connect the packaged device or integrated circuit 26 to the DUT board 22 over a longer period of the useful life of the electronic circuit tester 10 during actual testing. Additionally, it is desirable to provide a relatively rugged socket structure which minimizes the parasitic inductance, capacitance, and electrical signal phase delay. Such a socket structure would improve the repeatability and accuracy of the electronic circuit tester 10 during actual testing.

SUMMARY OF THE INVENTION

One embodiment of the invention provides a socket for interconnecting an electronic circuit, such as a packaged device or integrated circuit, being tested to a device- under-test (DUT) board of an electronic circuit tester. That is, a socket is provided for interconnecting at least one electrically conductive lead of the electronic circuit being tested to an electronic circuit tester for applying an electrical signal or suite of electrical signals to, and measuring the response(s) of, the electronic circuit.

In accordance with one embodiment of the invention, the socket comprises an electrically insulative housing, the housing comprising at least one slot having a longitudinal axis and a predetermined width, the housing further comprising a first channel and a second channel approximately perpendicular to the longitudinal axis of the slot. The socket also comprises a first elastomeric member disposed in the first channel and a second elastomeric member disposed in the second channel, the first and second elastomeric members spanning the width of the slot. The socket additionally comprises an electrically conductive contact frame disposed in the slot, the contact frame having a first end, a second end, a first surface opposite the at least one lead of the electronic circuit, and a second surface opposite the DUT board, the first end of the contact frame being sandwiched between the first elastomeric member and the DUT board and the second end of the contact frame being sandwiched between the second elastomeric member and the DUT board so that the first and second elastomeric members are compressed between the first and second channels of the housing and the first and second ends of the contact frame to mechanically bias the second surface of the contact frame into electrical contact with the DUT board. Finally, the socket comprises an electrically conductive contact having a first end, a second end, a first surface opposite the at least one lead of the electronic circuit, and a second surface opposite the first surface of the contact frame, the first end of the contact being configured to electrically contact the lead of the electronic circuit with the second end of the contact being in engagement with the second elastomeric member to mechanically bias the first end of the contact against the lead of the electronic circuit, the second surface of the contact being in electrical contact with the first surface of the contact frame. Preferably, the first end of the contact is configured to wipe the at least one lead of the electronic circuit, and the second surface of the contact wipes the first surface of the contact frame, as engagement of the lead with the first end of the contact causes the second surface of the contact to slide in a direction toward the second end of the contact.

In accordance with one implementation of the invention, the first channel and the second channel have an approximately square cross-section and the first and second elastomeric members have an approximately circular cross-section. Also, the contact frame consists of approximately 35.0 percent palladium, 30.0 percent silver, 14.0 percent copper, 10.0 percent gold, 10.0 percent platinum, and 1.0 percent zinc, and the contact consists of approximately 71.5 percent gold, 14.5 percent copper, 8.5 percent platinum, 4.5 percent silver, and 1.0 percent zinc. Finally, the first and second elastomeric members consist of silicone rubber.

Additionally, the socket preferably comprises a first point contact formed on the second surface of the contact frame proximate the first end of the contact frame and a second point contact formed on the second surface of the contact frame proximate the second end of the contact frame, and the first and second elastomeric members mechanically bias the first and second point contacts against the DUT board to effect electrical connection between the contact frame and the DUT board. Also, the contact frame preferably further comprises a projection proximate the first end of the contact frame, the projection having a surface coincident with the first surface of the contact frame, and engagement of the at least one lead of the electronic circuit with the contact causes the second surface of the contact to wipe the surface of the projection, whereby the electrical path length between the lead and the DUT board through the contact and contact frame is minimized.

Also, the contact frame preferably comprises a stop formed on the first surface of the contact frame intermediate the first and second ends of the contact frame, the stop having a predetermined height, and the contact preferably comprises a recessed track formed in the second surface of the contact, the track having a first end proximate the first end of the contact, a second end proximate the second end of the contact, and a predetermined depth greater than the predetermined height of the stop, so that sliding movement of the contact in a direction from the first end of the contact to the second end of the contact is limited by the stop engaging the first end of the track and sliding movement of the contact in a direction from the second end of the contact to the first end of the contact is limited by the stop engaging the second end of the track.

Preferably, the socket further comprises means for retaining the contact in engagement with the contact frame when the second surface of the contact slides with respect to the first surface of the contact frame. The means for retaining the contact in engagement with the contact frame preferably comprises a compliant retaining arm formed on the contact frame and extending from the second end of the contact frame and engaging the first surface of the contact. Also, the retaining arm preferably provides mechanical bias of the second surface of the contact against the first surface of the contact frame so that the second surface of the contact wipes the first surface of the contact frame when the contact slides. In accordance with one implementation of the invention, the retaining arm includes a first end connected to approximately the second end of the contact frame and a second end having a rounded contour to minimize friction between the retaining arm and the first surface of the contact.

The socket in accordance with the invention increases repeatability of connections and improves accuracy of measurements with the electronic circuit tester. This increases the precision of the measurement process.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings:

FIG. 4 is a cross-sectional view of the socket in accordance with the invention shown in FIG. 3;

FIG. 5 is a cross-sectional view similar to FIG. 4, which shows the socket in accordance with the invention in contact with a packaged device or integrated circuit being tested.

DETAILED DESCRIPTION OF THE PREFERRED EMBODIMENTS

Figure 3:
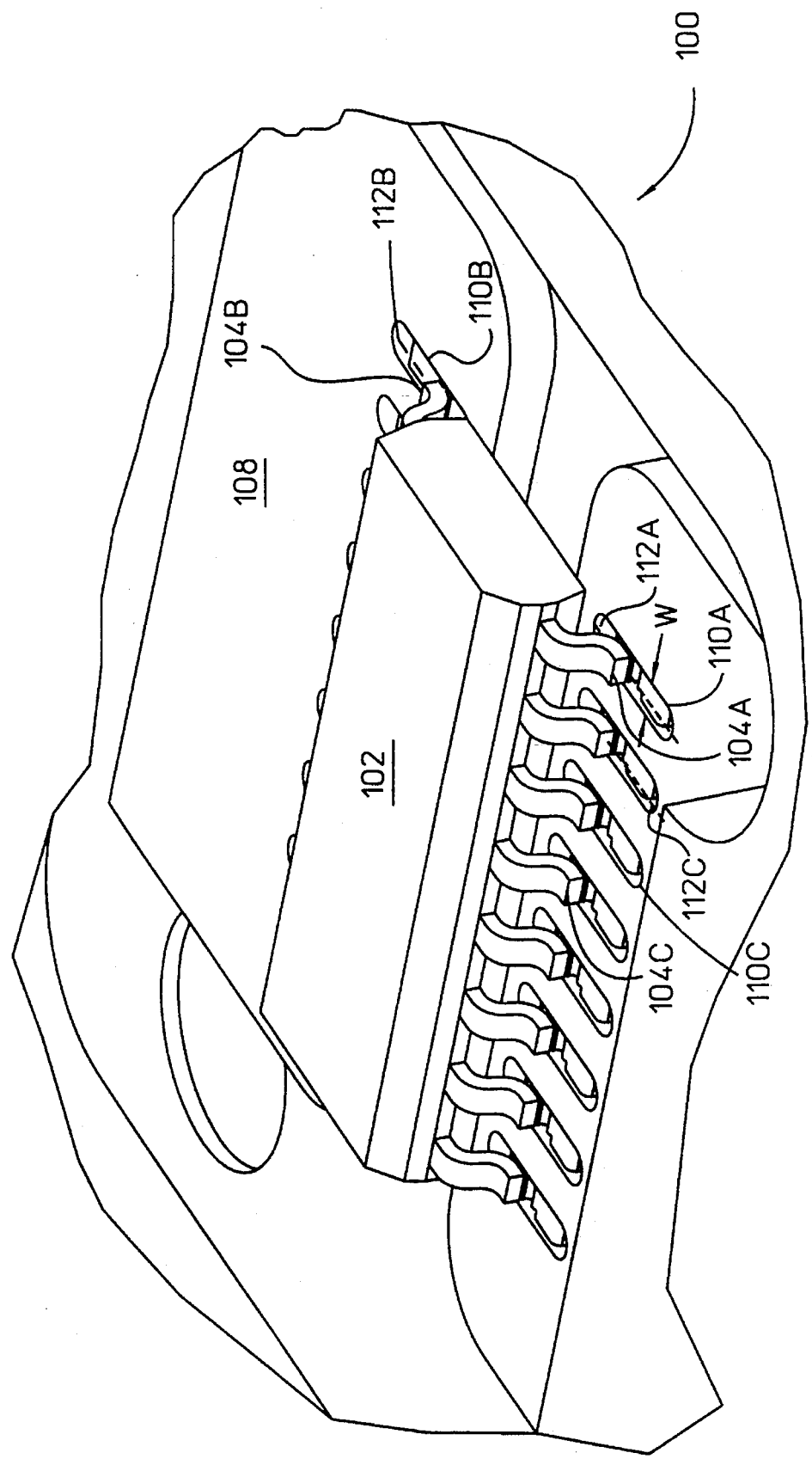
FIG. 3 is an isometric view of a socket for contacting a packaged device or integrated circuit in accordance with one embodiment of the invention.
Figure 6:
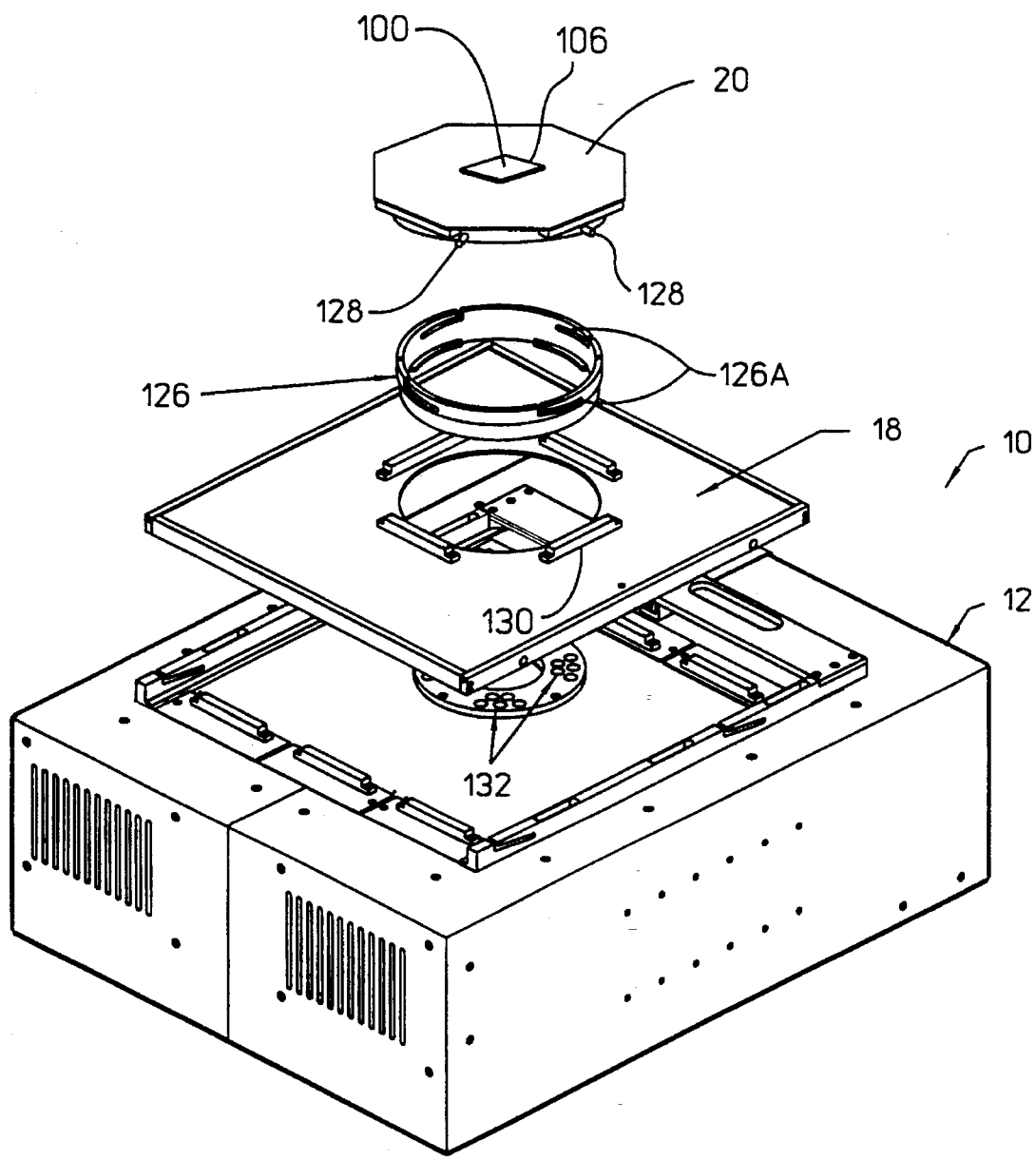
FIG. 6 shows a detail of an electronic circuit tester for the purpose of illustrating a fixture board and DUT board with a socket in accordance with the invention being mounted to a load board.

In accordance with one embodiment of the invention, a socket, generally indicated by the numeral 100 in FIGS. 3 and 4, is provided for interconnecting a packaged device or integrated circuit 102 to a device-under-test (DUT) board 106. The packaged device or integrated circuit 102 comprises at least one electrically conductive lead 104A, 104B, etc. As shown in FIG. 6, the DUT board 106 is incorporated into a fixture board 20 of an electronic circuit tester 10, as will be described in more detail below.

Considered in more detail, the socket 100 shown in FIGS. 3 and 4 contacts the leads 104A, 104B, etc., of the packaged device or integrated circuit 102 during testing and connects the leads to the DUT board 106. The socket 100 comprises an electrically insulative housing 108. The housing 108 comprises at least one slot 110A, 110B, etc. having a respective longitudinal axis 112A, 112B, etc. Each slot has a predetermined width W, as shown in FIG. 3. Finally, as shown in FIG. 4, the housing 108 further comprises a first channel 114 and a second channel 116 approximately perpendicular to the longitudinal axes 112A, 112B, etc. of the respective slots 110A, 110B, etc.

Referring to FIG. 4, the socket 100 additionally comprises a first elastomeric member 118 disposed in the first channel 114, the first elastomeric member spanning the width W of each slot 110A, 110C, etc. The socket further comprises a second elastomeric member 120 disposed in the second channel 116, the second elastomeric member also spanning the width W of each slot 110A, 110C, etc. For example, the first and second elastomeric members 118 and 120 can consist of silicone rubber.

As shown in FIG. 4, the first channel 114 and second channel 116 have an approximately square cross-section, and the first elastomeric member 118 and second elastomeric member 120 have an approximately circular cross-section. In one contemplated modification, the corners of the first channel 114 and the second channel 116 can be radiused.

As shown in FIG. 4, the socket 100 further comprises an electrically conductive contact frame 122 disposed in each slot 110A, 110B, etc. The contact frame 122 has a first end 122A, a second end 122B, a first surface 122C opposite the at least one lead 104A of the packaged device or integrated circuit 102, and a second surface 122D opposite the DUT board 106. The first end 122A of the contact frame 122 is sandwiched between the first elastomeric member 118 and the DUT board 106, and the second end 122B of the contact frame is sandwiched between the second elastomeric member 120 and the DUT board so that the first and second elastomeric members are compressed between the first channel 114 and second channel 116 of the housing 108 and the first end and second end of the contact frame, respectively, to mechanically bias the second surface 122D of the contact frame into electrical contact with the DUT board.

Preferably, as shown in FIG. 4, the socket 100 further comprises a first point contact 122E formed on the second surface 122D of the contact frame 122 proximate the first end 122A of the contact frame and a second point contact 122F formed on the second surface of the contact frame proximate the second end 122B of the contact frame. Therefore, the first and second elastomeric members 118 and 120 mechanically bias the first and second point contacts 122E and 122F of the contact frame 122 against the DUT board 106 to effect electrical connection between the contact frame and the DUT board.

The socket 100 also comprises an electrically conductive contact 124 for contacting each lead 104A, 104B, etc. The contact 124 has a first end 124A, a second end 124B, a first surface 124C opposite the at least one lead 104A of the packaged device or integrated circuit 102, and a second surface 124D opposite the first surface 122C of the contact frame 122. The first end 124A of the contact 124 is configured to electrically contact the at least one lead 104A of the packaged device or integrated circuit 102 with the second end 124B of the contact in engagement with the second elastomeric member 120 to mechanically bias the first end of the contact against the at least one lead of the packaged device or integrated circuit, and with the second surface 124D of the contact in electrical contact with the first surface 122C of the contact frame.

In one preferred embodiment of the socket 100 in accordance with the invention, as shown in FIG. 4, the contact frame 122 further comprises a projection 122G proximate the first end 122A of the contact frame. The projection 122G has a surface coincident with the first surface 122C of the contact frame 122. Therefore, engagement of the at least one lead 104A of the packaged device or integrated circuit 102 with the contact 124 causes the second surface 124D of the contact to wipe the surface 122C of the projection 122G of the contact frame 122, whereby the electrical path length between the at least one lead and the DUT board 106 through the contact and contact frame is minimized.

Also, the contact frame 122 further comprises a stop 122H formed on the first surface 122C of the contact frame intermediate the first and second ends 122A and 122B of the contact frame, the stop having a predetermined height. Additionally, the contact 124 further comprises a recessed track 124E formed in the second surface 124D of the contact, the track having a first end proximate the first end 124A of the contact, a second end proximate the second end 124B of the contact, and a predetermined depth greater than the predetermined height of the stop 122H.

Finally, as shown in FIG. 4, the socket 100 preferably further comprises means for retaining the contact 124 in engagement with the contact frame 122 when the second surface 124D of the contact slides with respect to the first surface 122C of the contact frame. In one preferred embodiment of the socket 100 in accordance with the invention, the means for retaining the contact 124 in engagement with the contact frame 122 comprises a compliant retaining arm 122I formed on the contact frame 122 and extending from the second end 122B of the contact frame and engaging the first surface 124C of the contact. Preferably, the retaining arm 122I provides mechanical bias of the second surface 124D of the contact 124 against the first surface 122C of the contact frame 122. In accordance with one implementation of the invention, the retaining arm 122I includes a first end connected to approximately the second end 122B of the contact frame 122 and a second end having a rounded contour 122J to minimize friction between the retaining arm and the first surface 124C of the contact 124 when the second surface 124D of the contact slides with respect to the first surface 122C of the contact frame.

The contact frame 122 can consist of approximately 35.0 percent palladium, 30.0 percent silver, 14.0 percent copper, 10.0 percent gold, 10.0 percent platinum, and 1.0 percent zinc. Such material is available is available in sheet form from The J. M. Ney Company located in Bloomfield, Conn. under the brand name "paliney 7." The contact frame 122 can be formed by wire electrical discharge milling (EDM).

Also, the contact 124 can consist of approximately 71.5 percent gold, 14.5 percent copper, 8.5 percent platinum, 4.5 percent silver, and 1.0 percent zinc. Such material is available from The J. M. Ney Company under the brand name "neyoro G." The contact 124 can also be formed by wire EDM. Additionally, the contact 124 is tumbled in a particulate abrasive material to produce a smooth first surface 124C.

Figure 1:
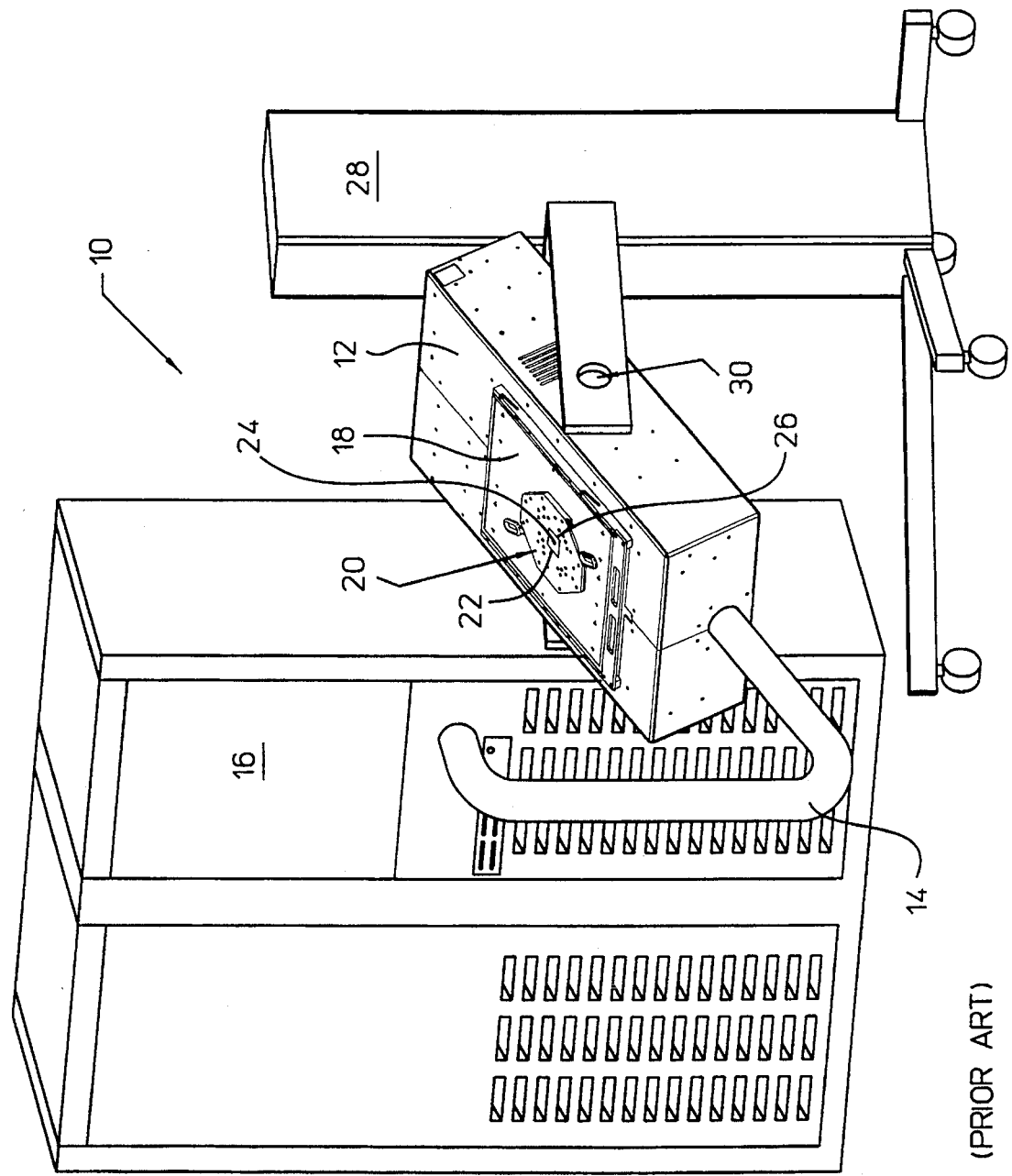
FIG. 1 is an isometric view of a conventional electronic circuit tester.
Figure 2:
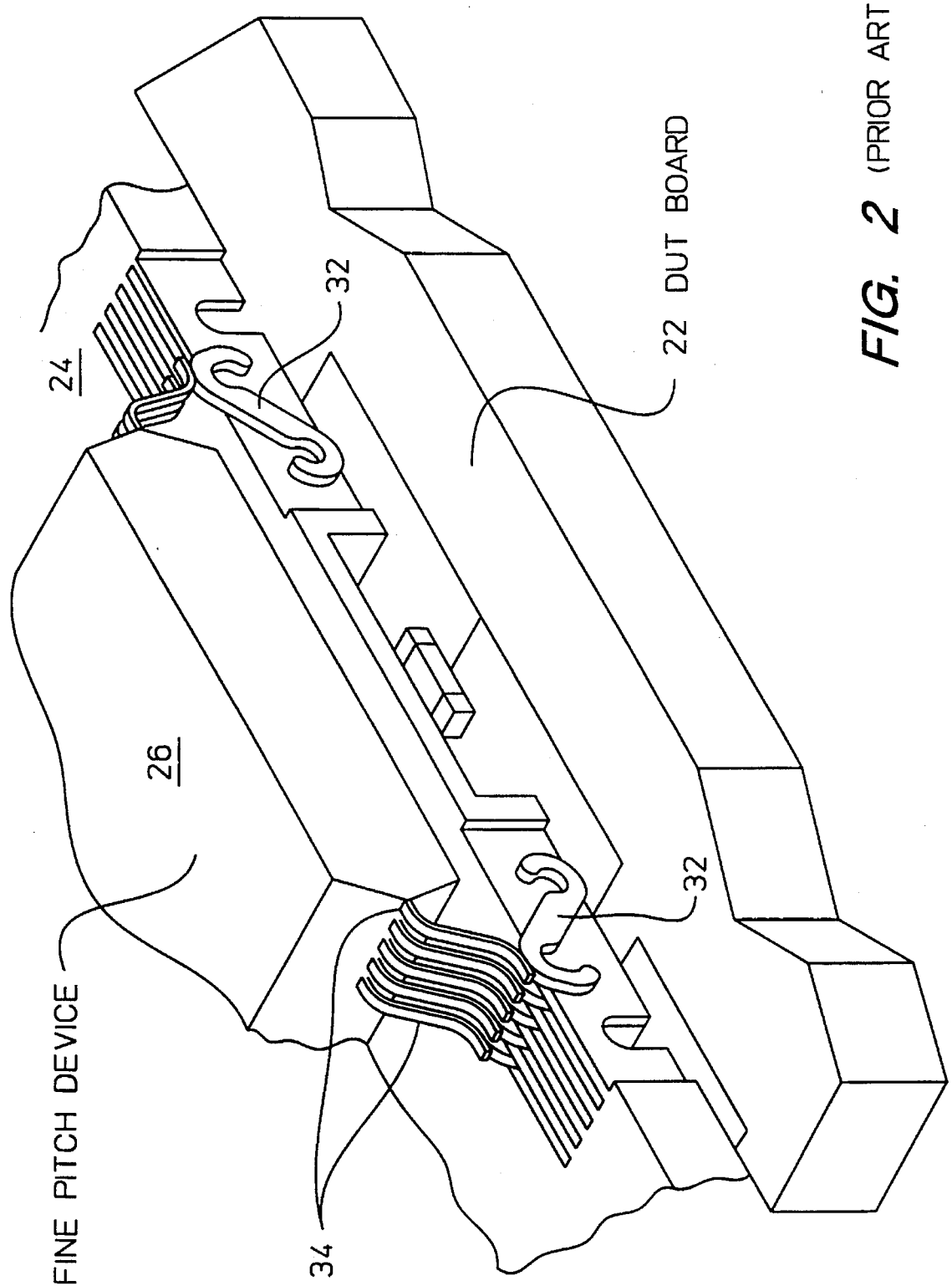
FIG. 2 is an isometric view of a conventional socket for contacting a packaged device or integrated circuit in the electronic circuit tester shown in FIG. 1.

In operation, the socket 100 is mounted to the DUT board 106, and the DUT board is in turn mounted to a fixture board, such as the fixture board 20 shown in FIGS. 1 and 6. As shown in FIG. 6, in order to install the fixture board 20 having the DUT board 106 with the socket 100 on the test head 12, the test head preferably comprises a pull down/eject ring 126 having a plurality of slots 126A. The fixture board 20 preferably comprises pins 128 which interfit in the slots 126A so that rotation of the pull down/eject ring 126 causes axial movement of connectors mounted on the fixture board toward mating connectors 130 mounted on the load board 18 and connectors 132 mounted on the test head 12 for effecting connection between the socket 100 and the test head.

As shown in FIGS. 4 and 5, engagement of the at least one lead 104A of the packaged device or integrated circuit 102 with the first end 124A of the contact 124 causes the second surface 124D of the contact to slide in a direction toward the second end 124B of the contact, and the second elastomeric member 120 is compressed, as indicated by the arrow 134 shown in FIG. 5. As the contact 124 slides, the first end 124A of the contact is configured to wipe the at least one lead 104A of the packaged device or integrated circuit 102 at a location indicated by the arrow 136 shown in FIG. 5. Also, as the contact 124 slides, the second surface 124D of the contact wipes the first surface 122C of the contact frame 122. The retaining arm 122I provides mechanical bias of the second surface 124D of the contact 124 against the first surface 122C of the contact frame 122 so that the second surface of the contact wipes the first surface of the contact frame as the contact slides. However, the first surface 124C of the contact 124 is contoured so that the retaining arm 122I is not displaced as the contact slides, whereby metal fatigue of the retaining arm is avoided. Sliding movement of the contact 124 in a direction from the first end 124A of the contact to the second end 124B of the contact is limited by the stop 122H engaging the first end of the track 124E, as shown in FIG. 5.

Upon removal of the packaged device or integrated circuit 102 from the socket 100, the compressed second elastomeric element 120 expands, which causes sliding movement of the contact 124 in a direction from the second end 124B of the contact to the first end 124A of the contact. Sliding movement of the contact 124 in a direction from second end 124B of the contact to the first end 124A of the contact is limited by the stop 122H engaging the second end of the track 124E upon removal of the packaged device or integrated circuit 102 from the socket 100.

Finally, the socket 100 in accordance with one embodiment of the invention is preferably configured to interface to automated material handlers which feed packaged devices and integrated circuits to the electronic circuit tester 10. In one implementation of the invention, the housing 108 comprises an approximately centrally disposed relieved region 138 to accommodate a mohawk 140 incorporated into an electronic circuit handler, such as a Daymarc 717 MonoRail integrated circuit handler, for feeding the packaged device or integrated circuit 102 to the socket 100, as shown in FIGS. 4 and 5.

The socket 100 in accordance with one embodiment of the invention provides repeatable interconnection of the packaged device or integrated circuit 102 and the DUT board 106. The socket 100 also minimizes the electrical signal path length between the at least one lead 104A of the packaged device or integrated circuit 102 and the DUT board 106 to minimize parasitic inductance, capacitance, and phase delay in electrical signals applied to and/or the measured response(s) of the packaged device or integrated circuit at high-frequency.

It will be understood and appreciated that the embodiment of the socket in accordance with the invention described above is susceptible to various additional modifications, changes, and adaptations. For example, the DUT board 106 can be integrated into the fixture board 20, rather than comprising a separate element mounted to the fixture board. Additionally, the arrangement of the stop 122H and the track 124E can be switched so that the stop is formed on the contact 124 and the track is formed on the contact frame 122. Also, the means for retaining the contact 124 in engagement with the contact frame 122 when the second surface 124D of the contact slides with respect to the first surface 122C of the contact frame can alternatively comprise a portion of the housing 108 or an additional elastomeric element spanning each slot 110A, 110C, etc. Also, a vacuum material handler can be used to feed packaged devices or integrated circuits to the socket, which obviates any need for a relieved region 138 in the housing 108.

Although the foregoing description discloses an electronic circuit tester which measures high-frequency electrical signals, many of the principles of the invention also apply in general to sockets. All is intended to be comprehended within the meaning and range of equivalents of the appended claims.

What is claimed is:

1. A socket for contacting an electronic circuit during testing, the electronic circuit including at least one electrically conductive lead, the socket for connecting the at least one lead to a device-under-test (DUT) board of an electronic circuit tester, the socket comprising:

an electrically insulative housing, the housing comprising at least one slot having a longitudinal axis and a predetermined width, the housing further comprising a first channel and a second channel approximately perpendicular to the longitudinal axis of the slot;

a first elastomeric member disposed in the first channel, the first elastomeric member spanning the width of the slot;

a second elastomeric member disposed in the second channel, the second elastomeric member spanning the width of the slot;

an electrically conductive contact frame disposed in the slot, the contact frame having a first end, a second end, a first surface substantially parallel to the at least one lead of the electronic circuit, and a second surface substantially parallel to the DUT board, the first end of the contact frame being sandwiched between the first elastomeric member and the DUT board and the second end of the contact frame being sandwiched between the second elastomeric member and the DUT board so that the first and second elastomeric members are compressed between the first and second channels of the housing and the first and second ends of the contact frame to mechanically bias the second surface of the contact frame into electrical contact with the DUT board;

an electrically conductive contact having a first end, a second end, a first surface substantially parallel to the at least one lead of the electronic circuit, and a second surface opposite the first surface of the contact frame, the first end of the contact being configured to electrically contact the lead of the electronic circuit with the second end of the contact being in engagement with the second elastomeric member to mechanically bias the first end of the contact against the lead of the electronic circuit, the second surface of the contact being in electrical contact with the first surface of the contact frame.

2. The socket according to claim 1 wherein the first channel and the second channel have an approximately square cross-section and the first and second elastomeric members have an approximately circular cross-section.

3. The socket according to claim 1 wherein the contact frame consists of approximately 35.0 percent palladium, 30.0 percent silver, 14.0 percent copper, 10.0 percent gold, 10.0 percent platinum, and 1.0 percent zinc and wherein the contact consists of approximately 71.5 percent gold, 14.5 percent copper, 8.5 percent platinum, 4.5 percent silver, and 1.0 percent zinc.

4. The socket according to claim 1 wherein the first and second elastomeric members consist of silicone rubber.

5. The socket according to claim 1, further comprising a first point contact formed on the second surface of the contact frame proximate the first end of the contact frame and a second point contact formed on the second surface of the contact frame proximate the second end of the contact frame, wherein the first and second elastomeric members mechanically bias the first and second point contacts against the DUT board to effect electrical connection between the contact frame and the DUT board.

6. The socket according to claim 1 wherein the contact frame further comprises a stop formed on the first surface of the contact frame intermediate the first and second ends of the contact frame, the stop having a predetermined height, and wherein the contact further comprises a recessed track formed in the second surface of the contact, the track having a first end proximate the first end of the contact, a second end proximate the second end of the contact, and a predetermined depth greater than the predetermined height of the stop, sliding movement of the contact in a direction from the first end of the contact to the second end of the contact being limited by the stop engaging the first end of the track and sliding movement of the contact in a direction from the second end of the contact to the first end of the contact being limited by the stop engaging the second end of the track.

7. The socket according to claim 1 wherein the housing comprises an approximately centrally disposed relieved region to accommodate a mohawk incorporated into an electronic circuit handler for feeding electronic circuits to the socket.

8. The socket according to claim 1 wherein engagement of the at least one lead of the electronic circuit with the first end of the contact causes the second surface of the contact to slide in a direction toward the second end of the contact and wherein the first end of the contact is configured to wipe the lead and the second surface of the contact wipes the first surface of the contact frame when the contact slides.

9. The socket according to claim 8 wherein the contact frame comprises a projection proximate the first end of the contact frame, the projection having a surface coincident with the first surface of the contact frame, and wherein engagement of the at least one lead of the electronic circuit with the contact causes the second surface of the contact to wipe the surface of the projection, whereby the electrical path length between the lead and the DUT board through the contact and contact frame is minimized.

10. The socket according to claim 1 wherein the second surface of the contact is in slidable engagement with the first surface of the contact frame and the socket further comprises means for retaining the contact in engagement with the contact frame when the second surface of the contact slides with respect to the first surface of the contact frame.

11. The socket according to claim 10 wherein the means for retaining the contact in engagement with the contact frame comprises a compliant retaining arm formed on the contact frame and extending from the second end of the contact frame and engaging the first surface of the contact.

12. The socket according to claim 11 wherein engagement of the at least one lead of the electronic circuit with the first end of the contact causes the second surface of the contact to slide in a direction toward the second end of the contact and wherein the first end of the contact is configured to wipe the lead and the retaining arm provides mechanical bias of the second surface of the contact against the first surface of the contact frame so that the second surface of the contact wipes the first surface of the contact frame when the contact slides.

13. The socket according to claim 12 wherein the retaining arm includes a first end connected to approximately the second end of the contact frame and a second end having a rounded contour to minimize friction between the retaining arm and the first surface of the contact.

14. An electrically conductive contact frame incorporated into a socket, the socket comprising an electrically insulative housing having at least one slot, the socket comprising at least one electrically conductive contact having an end for contacting at least one electrically conductive lead of an electronic circuit during testing and a surface substantially parallel to the at least one lead, the socket for connecting the at least one lead to a device-under-test (DUT) board of an electronic circuit tester, the contact frame comprising:

a first end, a second end, a first surface substantially parallel to the at least one lead of the electronic circuit, and a second surface substantially parallel to the DUT board, the contact frame being configured to be disposed in the slot, the first end of the contact frame being configured to be sandwiched between a first elastomeric member and the DUT board and the second end of the contact frame being configured to be sandwiched between a second elastomeric member and the DUT board so that the first and second elastomeric members are compressed between a first channel and a second channel, respectively, of a housing incorporated into the socket and the first and second ends of the contact frame to mechanically bias the second surface of the contact frame into electrical contact with the DUT board;

the first surface of the contact frame being configured to electrically contact the surface of the contact substantially parallel to the at least one lead; and the second surface of the contact frame being configured to electrically contact the DUT board.

15. The socket according to claim 14 wherein the contact frame consists of approximately 35.0 percent palladium, 30.0 percent silver, 14.0 percent copper, 10.0 percent gold, 10.0 percent platinum, and 1.0 percent zinc.

16. The contact frame according to claim 14 further comprising a first point contact formed on the second surface of the contact frame proximate the first end of the contact frame and a second point contact formed on the second surface of the contact frame proximate the second end of the contact frame, wherein the first and second elastomeric members mechanically bias the first and second point contacts against the DUT board to effect electrical connection between the contact frame and the DUT board.

17. The contact frame according to claim 14 further comprising a projection proximate the first end of the contact frame, the projection having a surface coincident with the first surface of the contact frame, and wherein engagement of the at least one lead of the electronic circuit with the contact causes the second surface of the contact to wipe the surface of the projection, whereby the electrical path length between the lead and the DUT board through the contact and contact frame is minimized.

18. The socket according to claim 14 wherein the contact frame further comprises a compliant retaining arm formed on the contact frame and extending from the second end of the contact frame and engaging the first surface of the contact for retaining the contact in engagement with the contact frame.

* * * * *